United States Patent
Yagisawa

(10) Patent No.: US 9,444,552 B2
(45) Date of Patent: Sep. 13, 2016

(54) OPTICAL RECEIVER MODULE INCLUDING PLURALITY OF PHOTO DETECTORS

(71) Applicant: FUJITSU LIMITED, Kawasaki-shi, Kanagawa (JP)

(72) Inventor: Takatoshi Yagisawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/446,471

(22) Filed: Jul. 30, 2014

(65) Prior Publication Data

US 2015/0069220 A1 Mar. 12, 2015

(30) Foreign Application Priority Data

Sep. 10, 2013 (JP) ................... 2013-187716

(51) Int. Cl.
*H01J 40/14* (2006.01)
*H04B 10/40* (2013.01)
*H03F 3/08* (2006.01)
*H04B 10/60* (2013.01)
*H05K 1/02* (2006.01)
*H05K 1/18* (2006.01)

(52) U.S. Cl.
CPC ............ *H04B 10/40* (2013.01); *H03F 3/08* (2013.01); *H04B 10/60* (2013.01); *H05K 1/0243* (2013.01); *H05K 1/181* (2013.01); *H05K 2201/10121* (2013.01)

(58) Field of Classification Search
CPC ............ H01L 31/0224; H01L 31/02016; H04B 10/40
USPC ............ 250/214 R, 214 A, 214 LA, 214.1; 257/433, 448, E31.124; 398/140, 164, 398/202
See application file for complete search history.

(56) References Cited

U.S. PATENT DOCUMENTS

| | | |
|---|---|---|
| 6,643,472 B1 | 11/2003 | Sakamoto et al. |
| 2003/0081297 A1 | 5/2003 | Hasegawa et al. |
| 2004/0129991 A1 | 7/2004 | Lai et al. |
| 2012/0043584 A1* | 2/2012 | Joshi ............ H01L 31/02024 257/184 |
| 2012/0170944 A1 | 7/2012 | Yagisawa et al. |
| 2012/0292731 A1 | 11/2012 | Toyonaka et al. |

FOREIGN PATENT DOCUMENTS

| | | |
|---|---|---|
| JP | 2000-244419 | 9/2000 |
| JP | 2001-127561 | 5/2001 |
| JP | 2003-134051 | 5/2003 |
| JP | 2003-224408 | 8/2003 |
| JP | 2012-142822 | 7/2012 |

OTHER PUBLICATIONS

EESR—Extended European Search Report issued on Feb. 5, 2015 for corresponding European Patent Application No. 14178911.5.
CNOA—Office Action of Chinese Patent Application No. 201410406506.2 dated Feb. 3, 2016, with English translation.

* cited by examiner

*Primary Examiner* — Kevin Pyo
(74) *Attorney, Agent, or Firm* — Fujitsu Patent Center

(57) ABSTRACT

An optical receiver module includes: a circuit board; a plurality of photo detectors mounted on a first surface of the circuit board; a plurality of amplifiers mounted on the first surface; a plurality of anode wiring patterns that are respectively formed between anode terminals of the photo detectors and the amplifiers on the first surface; a plurality of cathode wiring patterns that are respectively formed between cathode terminals of the plurality of photo detectors and the plurality of amplifiers on the first surface; and an electrode formed on a second surface of the circuit board or in an inner layer of the circuit board so as to include a region in which the plurality of cathode wiring patterns are formed. The plurality of cathode wiring patterns are respectively electrically connected to the electrode.

8 Claims, 15 Drawing Sheets

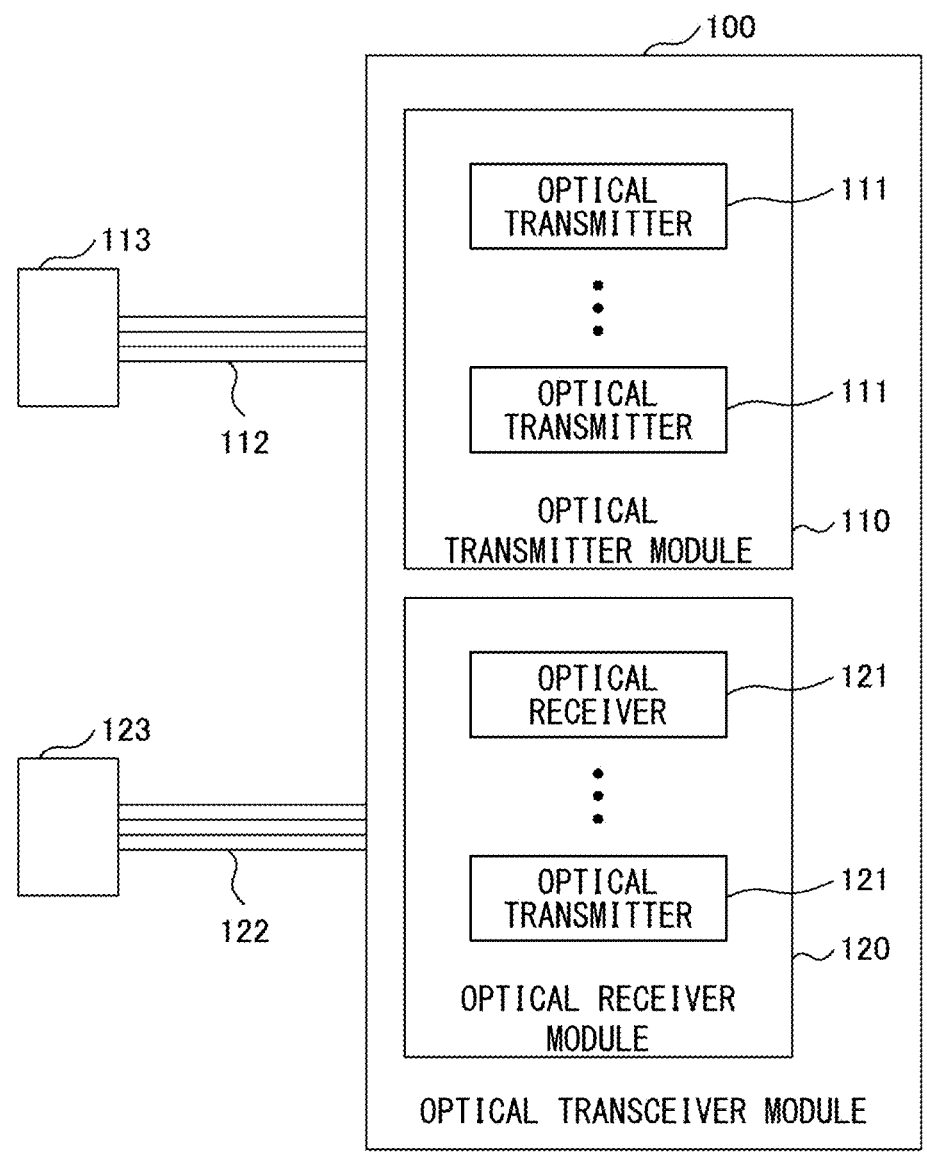
F I G. 1

F I G. 3A
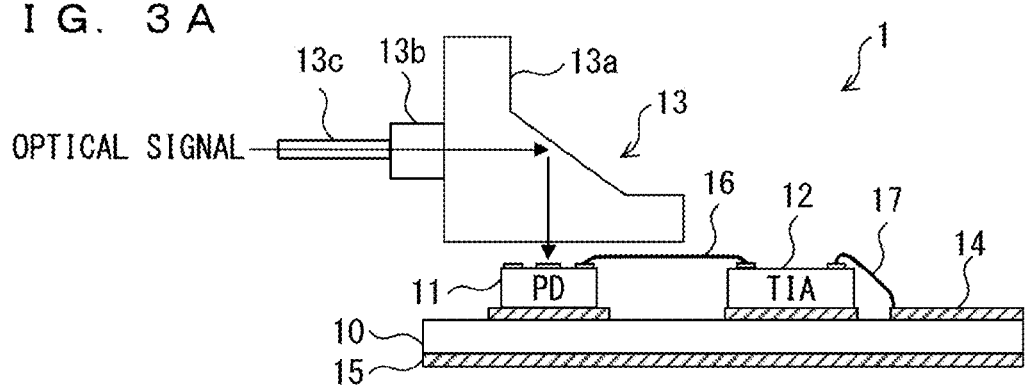
F I G. 3B
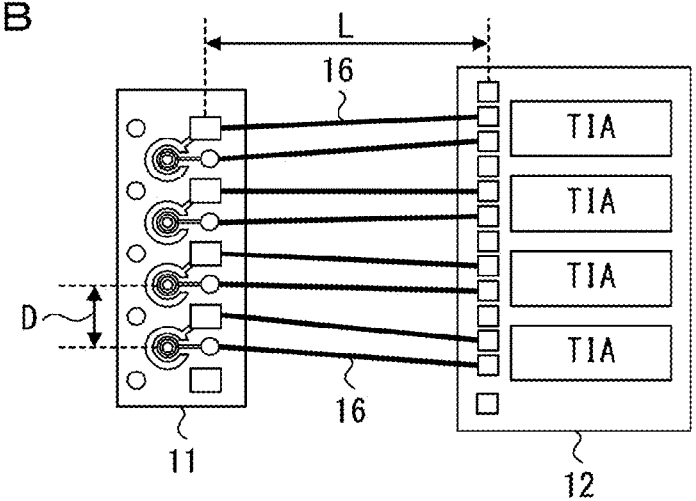

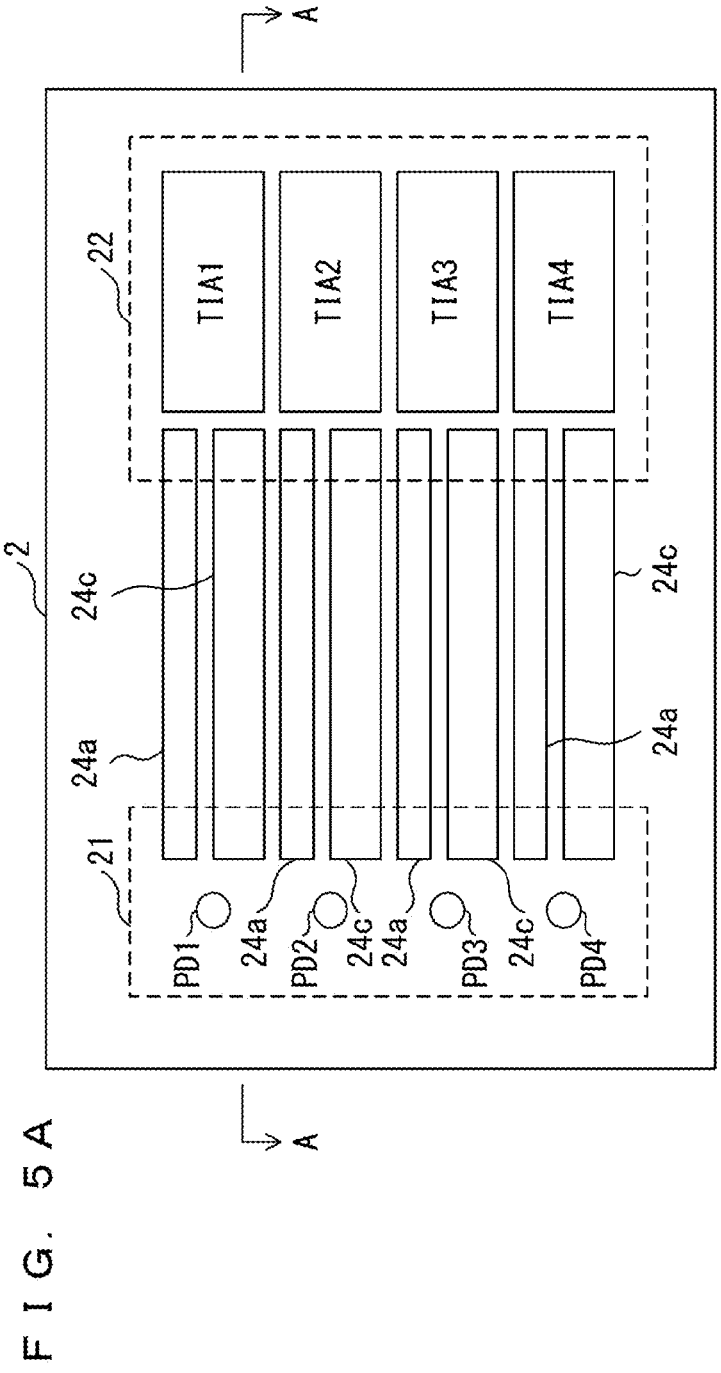
F I G. 5A
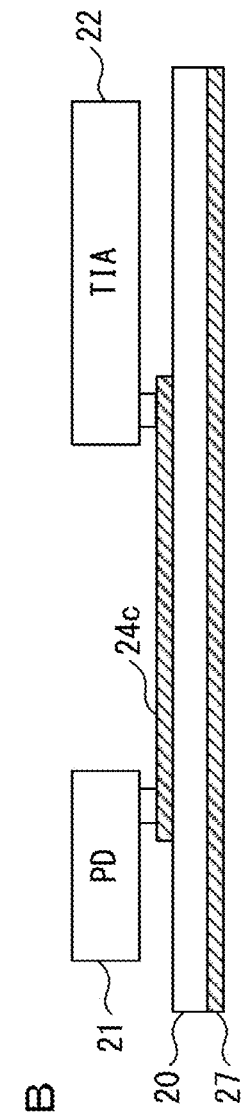
F I G. 5B

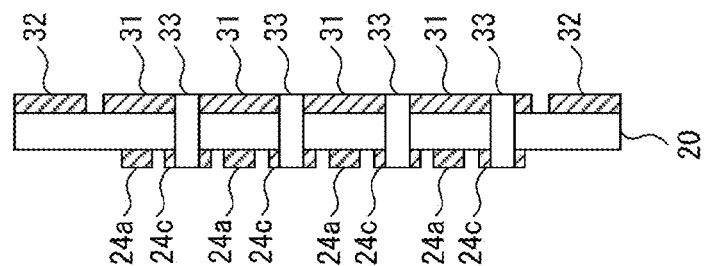
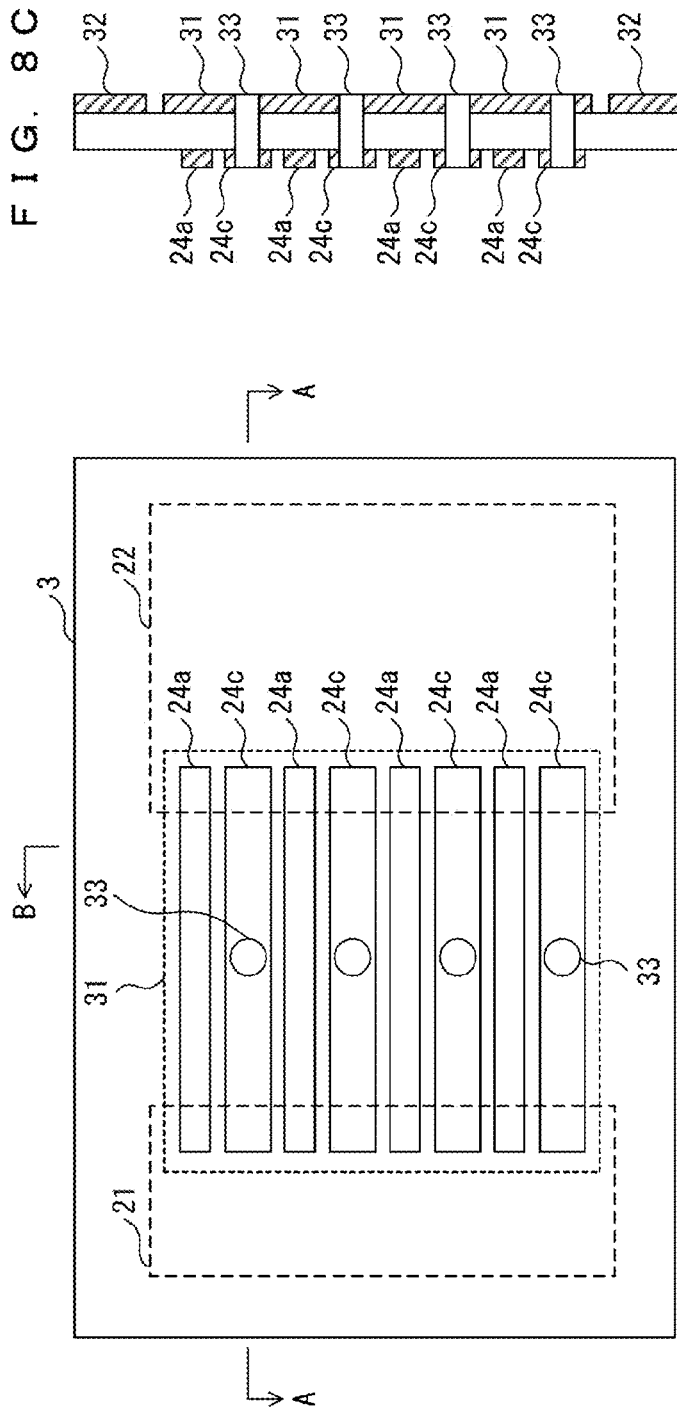
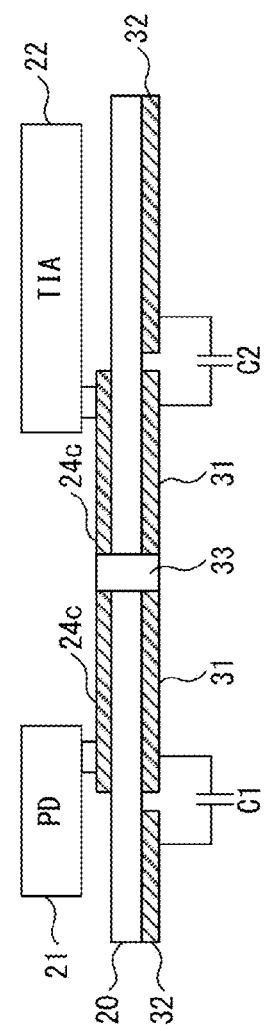

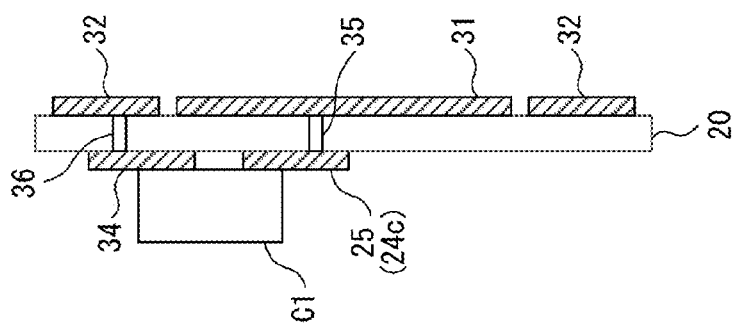
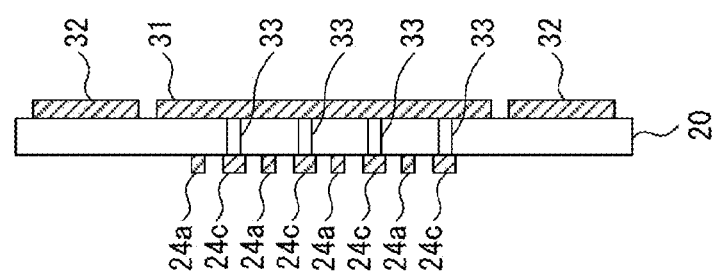
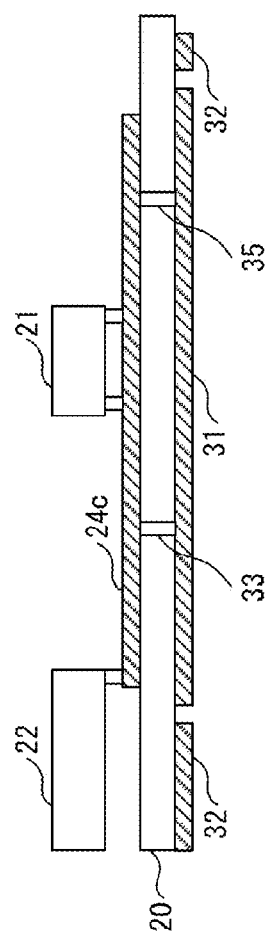

FREQUENCY (GHz)

FREQUENCY (GHz)

F I G. 1 3 A
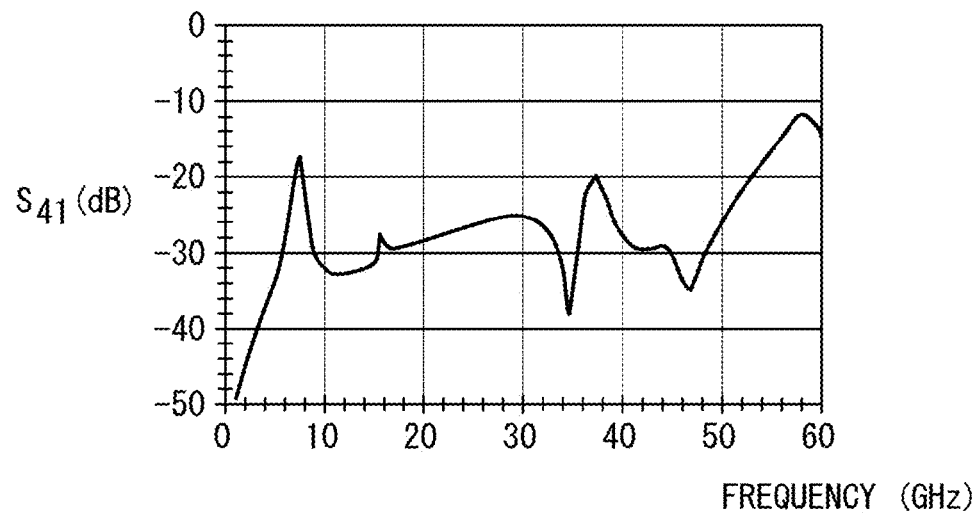
F I G. 1 3 B
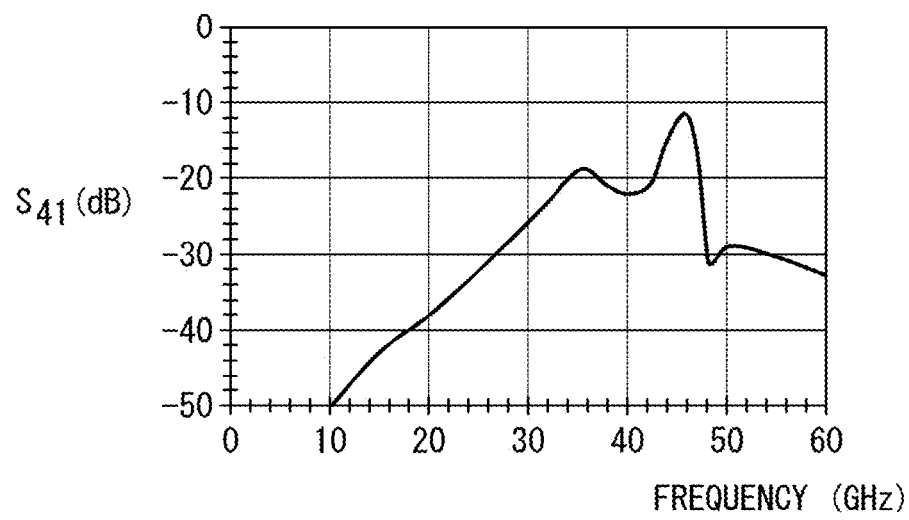

F I G. 1 4 A
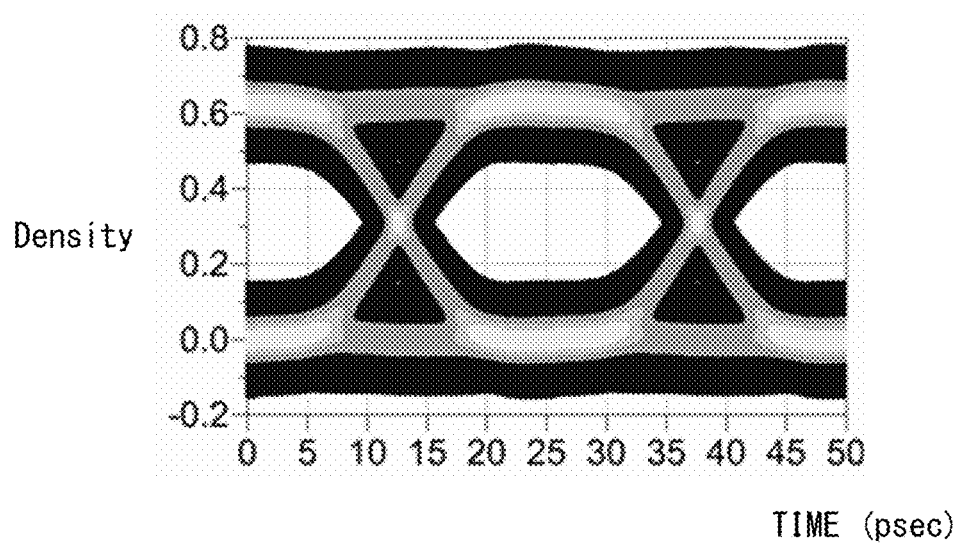
F I G. 1 4 B
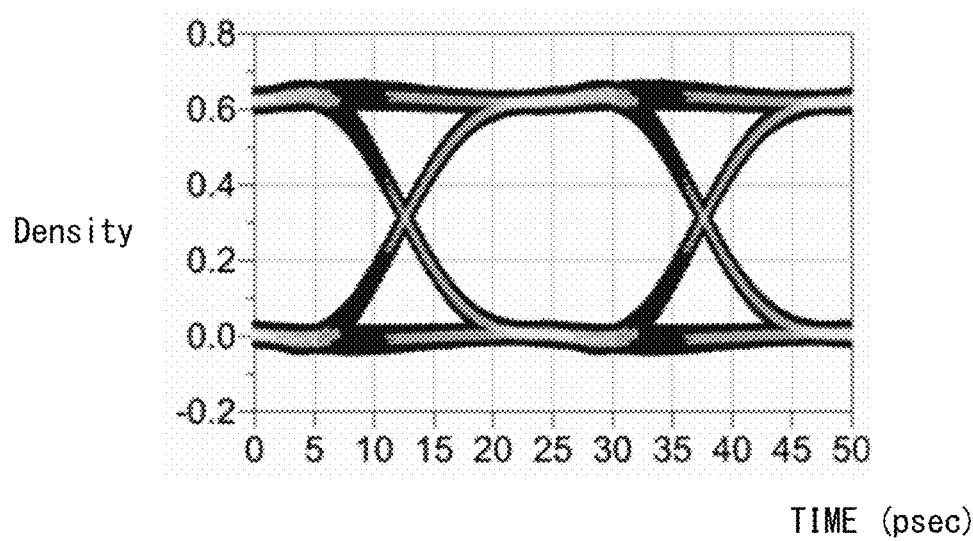

OPTICAL RECEIVER MODULE INCLUDING PLURALITY OF PHOTO DETECTORS

CROSS-REFERENCE TO RELATED APPLICATION

This application is based upon and claims the benefit of priority of the prior Japanese Patent Application No. 2013-187716, filed on Sep. 10, 2013, the entire contents of which are incorporated herein by reference.

FIELD

The embodiments discussed herein are related to an optical receiver module that includes a plurality of photo detectors.

BACKGROUND

A large-scale computer system or a super computer includes a plurality of processing units that operate in parallel. The plurality of processing units are connected by optical interconnection in order to realize high-speed processing.

The optical interconnection provides a plurality of optical channels in many cases. In this case, the optical interconnection is implemented by an optical module (or an optical transceiver) including a plurality of optical transmitters and a plurality of optical receivers, and a plurality of optical fiber transmission lines.

An optical module is requested to be reduced in size in many cases. Therefore, the plurality of optical receivers in the optical module are densely mounted on one circuit board. Similarly, the plurality of optical transmitters in the optical module are densely mounted on one circuit board.

As a related technique, an optical receiver including a photodiode array is proposed (for example, Japanese Laid-open Patent Publication No. 2012-142822). In addition, a technique for improving frequency characteristics of an optical receiver module is proposed (for example, Japanese Laid-open Patent Publication No. 2003-134051 or Japanese Laid-open Patent Publication No. 2001-127561). Further, a technique for improving isolation characteristics between signal lines is improved (for example, Japanese Laid-open Patent Publication No. 2003-224408). Furthermore, a bias circuit that stably operates an APD that receives an optical signal is proposed (for example, Japanese Laid-open Patent Publication No. 2000-244419).

In an optical receiver module in which a plurality of optical receivers are densely mounted on a circuit board, crosstalk between channels may occur. However, in conventional technologies, it may be difficult to suppress the crosstalk between channels. Particularly, in an ultra high-speed transmission system exceeding 25 Gbps, it is difficult to sufficiently suppress the crosstalk between channels in an optical receiver module.

SUMMARY

According to an aspect of the embodiments, an optical receiver module includes: a circuit board; a plurality of photo detectors mounted on a first surface of the circuit board; a plurality of amplifiers mounted on the first surface of the circuit board, the plurality of amplifiers corresponding to the plurality of photo detectors; a plurality of anode wiring patterns that are respectively formed between anode terminals of the plurality of photo detectors and the plurality of amplifiers on the first surface of the circuit board; a plurality of cathode wiring patterns that are respectively formed between cathode terminals of the plurality of photo detectors and the plurality of amplifiers on the first surface of the circuit board; and an electrode formed on a second surface of the circuit board or in an inner layer of the circuit board so as to include a region in which the plurality of cathode wiring patterns are formed. The plurality of cathode wiring patterns are respectively electrically connected to the electrode.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 illustrates a configuration of an optical transceiver module according to an embodiment of the present invention.

FIGS. 3A and 3B illustrate a configuration of an optical receiver module according to the first embodiment.

FIGS. 5A and 5B illustrate a configuration of an optical receiver module according to the second embodiment.

FIGS. 8A-8C illustrate a configuration of an optical receiver module according to the third embodiment.

FIGS. 10A-10C illustrate a cross section of the optical receiver module illustrated in FIGS. 9A and 9B.

FIGS. 11A, 11B, 12A, 12B, 13A, 13B, 14A and 14B illustrate simulation results related to effects according to the third embodiment.

DESCRIPTION OF EMBODIMENTS

Figure 2:
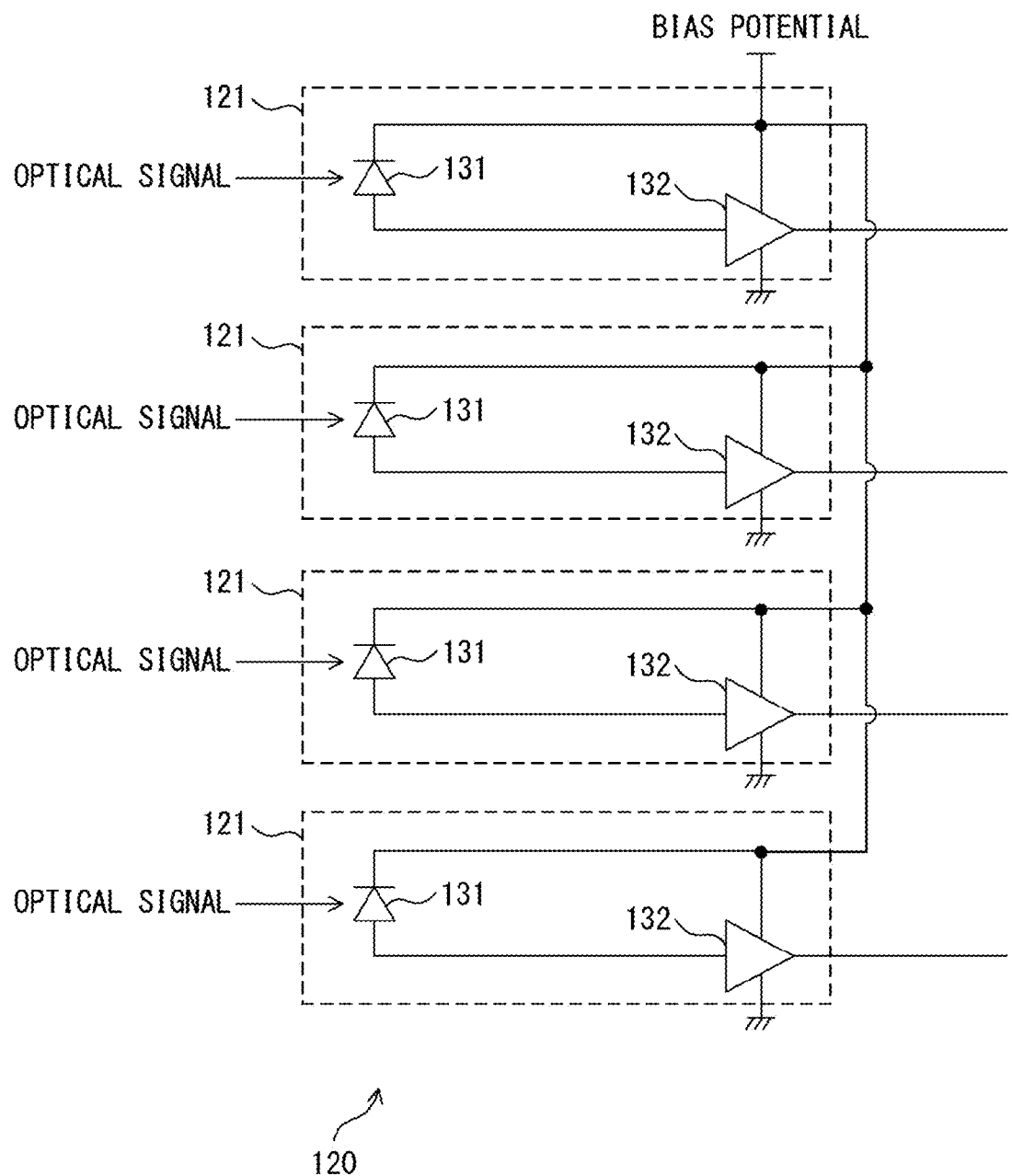
FIG. 2 illustrates an example of an equivalent circuit of an optical receiver module.

FIG. 1 illustrates a configuration of an optical transceiver module according to an embodiment of the present invention. The optical transceiver module 100 according to an embodiment of the present invention includes an optical transmitter module 110 and an optical receiver module 120, as illustrated in FIG. 1.

The optical transmitter module 110 includes a plurality of optical transmitters 111. Each of the optical transmitters 111 includes a laser light source and a driving circuit, and generates an optical signal from a given data signal. To the optical transmitter module 110, a transmission optical waveguide 112 including a plurality of optical waveguides corresponding to the plurality of optical transmitters 111 is optically coupled. At the end of the transmission optical waveguide 112, an optical connector 113 is provided. The transmission optical waveguide 112 may guide a plurality of optical signals generated by the optical transmitter module 110 to the optical connector 113. An optical fiber may be coupled to the optical connector 113.

The optical receiver module 120 includes a plurality of optical receivers 121. Each of the optical receivers 121 includes a photo detector and an amplifier that amplifies an electrical signal obtained by the photo detector. Alternatively, each of the optical receivers 121 includes a photo detector and an amplifier that converts a current signal obtained by the photo detector into a voltage signal. To the optical receiver module 120, a reception optical waveguide 122 including a plurality of optical waveguides corresponding to the plurality of optical receivers 121 is optically coupled. At the end of the reception optical waveguide 122, an optical connector 123 is provided. The reception optical waveguide 122 may guide an optical signal input via the optical connector 123 to the optical receiver module 120. An optical fiber may be coupled to the optical connector 123.

The transmission optical waveguide 112 and the reception optical waveguide 122 are implemented by, for example, a polymer waveguide. The connectors 113 and 123 are implemented by, for example, an MT connector or a PMT connector.

The optical transceiver module 100 is coupled to, for example, a motherboard of a computer system. In this case, the optical transceiver module 100 is coupled to, for example, a connector provided on the motherboard. The optical transceiver module 100 may be attached approximately vertically to the motherboard, or may be attached approximately in parallel to the motherboard. Electric power used by each device on the optical transceiver module 100 is supplied from the motherboard to the optical transceiver module 100. Further, a ground potential of the optical transceiver module 100 may be supplied from the motherboard.

FIG. 2 illustrates an example of an equivalent circuit of the optical receiver module 120. In this example, the optical receiver module 120 includes four optical receivers 121. Each of the optical receivers 121 includes a photo detector (PD) 131 and an amplifier 132. The amplifier 132 is a Trans-Impedance Amplifier (TIA) in this example. Accordingly, hereinafter, the amplifier is sometimes referred to as a "TIA".

The photo detector 131 is implemented by a photodiode. Namely, the photo detector 131 includes an anode terminal and a cathode terminal. The TIA 132 includes a signal input terminal, a signal output terminal, a bias terminal, a ground terminal, and a control terminal. In FIG. 2, the control terminal is omitted.

An anode terminal of each of the photo detectors 131 is electrically connected to a signal input terminal of a corresponding TIA 132 by, for example, a wiring pattern. In addition, a cathode terminal of each of the photo detectors 131 is electrically connected to a bias terminal of a corresponding TIA 132 by, for example, a wiring pattern. Here, as a bias potential is applied to the bias terminal of the TIA 132, a bias potential is also applied to the cathode terminal of the photo detector 131. Therefore, when an optical signal is input to the photo detector 131, a current signal representing an intensity of the optical signal is guided to the signal input terminal of the corresponding TIA 132. The TIA 132 converts the current signal generated by the photo detector 131 into a voltage signal, and outputs the voltage signal.

In the optical receiver module 120, it is requested that a bandwidth or the speed of each of the optical receivers 121 be increased. In addition, in order to reduce the size of the optical receiver module 120, the plurality of optical receivers 121 are mounted close to each other. For that reason, a technique for suppressing crosstalk between channels is requested.

First Embodiment

FIGS. 3A and 3B illustrate a configuration of an optical receiver module according to the first embodiment. FIG. 3A schematically illustrates the optical receiver module viewed from a side. FIG. 3B schematically illustrates a portion of the optical receiver module viewed from above.

As illustrated in FIGS. 3A and 3B, the optical receiver module 1 according to the first embodiment includes a circuit board 10, a photo detector circuit (PD) 11, an amplifier circuit (TIA) 12, and an optical circuit 13. The circuit board 10 is, for example, a Printed Circuit Board (PCB). On a front surface and a reverse surface of the circuit board 10, a wiring pattern (printed pattern) 14 and a ground electrode 15 are formed.

On the circuit board 10, the photo detector circuit 11 and the amplifier circuit 12 are mounted. The photo detector circuit 11 includes a plurality of photo detectors. Namely, the photo detector circuit 11 may be, for example, a PD array. In this example, the photo detector circuit 11 includes four photo detectors, as illustrated in FIG. 3B. Each of the photo detectors is implemented by a photodiode. The photo detector of the photo detector circuit 11 corresponds to the photo detector 131 illustrated in FIG. 2. The amplifier circuit 12 includes a plurality of TIAs. In this example, the amplifier circuit 12 includes four TIAs, as illustrated in FIG. 3B. The TIA of the amplifier circuit 12 corresponds to the TIA 132 illustrated in FIG. 2.

As illustrated in FIG. 3A, the optical circuit 13 includes a 45-degree mirror 13a. In addition, the optical circuit 13 may accommodate an optical fiber 13c by using an optical connector 13b. The optical circuit 13 guides a received optical signal to the photo detector circuit 11. Namely, an optical signal input via the optical fiber 13c is guided to the photo detector circuit 11 by the 45-degree mirror 13a. The optical circuit 13 may accommodate a plurality of optical fibers 13c, although this is not illustrated. In this case, an optical signal input via each of the optical fibers 13c is guided to a corresponding photo detector by the 45-degree mirror 13a.

The photo detector circuit 11 and the amplifier circuit 12 are electrically connected by wire bonding. Namely, each of the photo detectors of the photo detector circuit 11 is electrically connected to a corresponding TIA of the amplifier circuit 12 by a wire 16. In this example, the amplifier circuit 12 and the wiring pattern 14 are also electrically connected by a wire 17.

Each of the photo detectors of the photo detector circuit 11 includes an anode terminal and a cathode terminal. The anode terminal and the cathode terminal of each of the photo detectors are electrically connected to a signal input terminal and a bias terminal of the corresponding TIA, respectively, as described with reference to FIG. 2.

As described above, in the first embodiment, the photo detector of the photo detector circuit 11 and the TIA of the amplifier circuit 12 are electrically connected by the wire 16. Here, when a transmission rate of data is high, it is preferable that a length L of the wire 16 be short. However, in the current technology, it is difficult to make the wire 16 sufficiently short. As an example, $L>0.4$ mm. In addition, in order to reduce the size of the optical receiver module 1, the plurality of photo detectors are mounted close to each other, and the plurality of TIAs are mounted close to each other. As an example, a distance D at which each device is mounted is 0.25 mm. In this case, a distance between electrode pads for bonding the wire 16 is 0.125 mm. Therefore, between the photo detector circuit 11 and the amplifier circuit 12, a plurality of wires 16 are provided very close to each other, and a large crosstalk may occur between channels.

<Flip-Chip Mounting>

Figure 4:
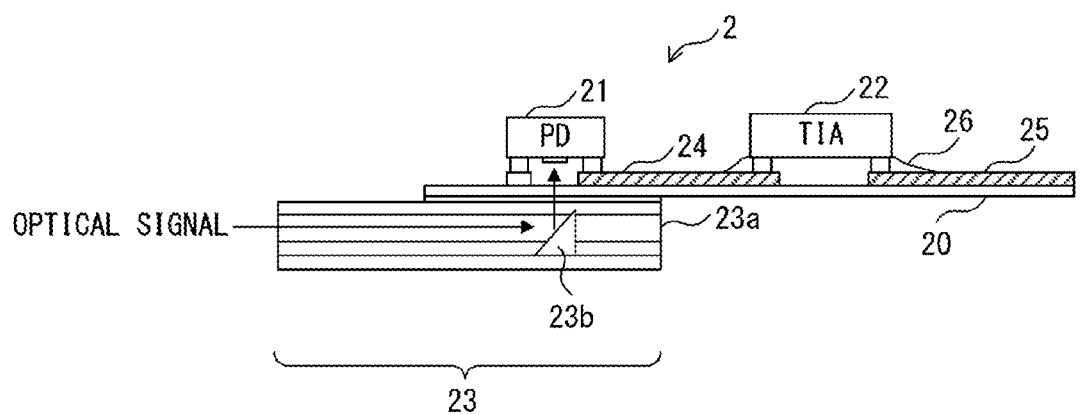
FIG. 4 illustrates an example of a flip-chip mounted optical receiver module.

FIG. 4 illustrates an example of a flip-chip mounted optical receiver module. As illustrated in FIG. 4, the flip-chip mounted optical receiver module includes a circuit board 20, a photo detector circuit (PD) 21, an amplifier circuit (TIA) 22, and an optical circuit 23. The circuit board 20 is, for example, a flexible printed circuit (FPC). On a surface of the circuit board 20, wiring patterns 24 and 25 and the like are formed.

On the circuit board 20, the photo detector circuit 21 and the amplifier circuit 22 are mounted. The photo detector circuit 21 includes a plurality of photo detectors similarly to the photo detector circuit 11 illustrated in FIGS. 3A and 3B. Namely, the photo detector circuit 21 is, for example, a PD array. Each of the photo detectors is implemented by a photodiode. Namely, the photo detector of the photo detector circuit 21 corresponds to the photo detector 131 illustrated in FIG. 2. In addition, the amplifier circuit 22 includes a plurality of TIAs similarly to the amplifier circuit 12 illustrated in FIGS. 3A and 3B. The TIA of the amplifier circuit 22 corresponds to the TIA 132 illustrated in FIG. 2. However, the photo detector circuit 21 and the amplifier circuit 22 are each a flip-chip device. Namely, the photo detector circuit 21 and the amplifier circuit 22 are electrically connected to a wiring pattern or an electrode of the circuit board 20 by flip-chip mounting. The photo detector circuit 21 and/or the amplifier circuit 22 are fixed to the circuit board 20 by an underfill 26. In the example illustrated in FIG. 4, the amplifier circuit 22 is fixed to the circuit board 20 by the underfill 26.

The optical circuit 23 includes an optical waveguide 23a and a 45-degree mirror 23b. In addition, the optical circuit 23 may accommodate an optical fiber not illustrated. An optical signal input via the optical fiber is guided to the photo detector circuit 21 by the optical waveguide 23a and the 45-degree mirror 23b. The optical circuit 23 may accommodate a plurality of optical fibers, although these are not illustrated. In this case, an optical signal input via each of the optical fibers is guided to a corresponding photo detector.

The photo detector circuit 21 and the amplifier circuit 22 are electrically connected by the wiring pattern 24 formed on the surface of the circuit board 20. Namely, each of the photo detectors of the photo detector circuit 21 is electrically connected to a corresponding TIA of the amplifier circuit 22 by the wiring pattern 24.

Second Embodiment

FIGS. 5A and 5B illustrate a configuration of an optical receiver module according to the second embodiment. The optical receiver module 2 according to the second embodiment is configured by flip-chip mounting illustrated in FIG. 4. Therefore, the optical receiver module 2 includes a circuit board 20, a photo detector circuit (PD) 21, an amplifier circuit (TIA) 22, and an optical circuit 23.

FIG. 5A schematically illustrates an arrangement of a photo detector, a TIA, and a wiring pattern. FIG. 5B schematically illustrates a cross section (an A-A cross section in FIG. 5A) of the optical receiver module 2. In FIGS. 5A and 5B, the optical circuit 23, a wiring pattern 25, and an underfill 26 are omitted.

In this example, the photo detector circuit 21 includes four photo detectors PD1-PD4. In addition, the amplifier circuit 22 includes four trans-impedance amplifiers TIA1-TIA4. Each of the photo detectors PD1-PD4 is electrically connected to a corresponding TIA1-TIA4 by an anode wiring pattern 24a and a cathode wiring pattern 24c. The anode wiring pattern 24a and the cathode wiring pattern 24c are formed on one surface of the circuit board 20. On the other surface (i.e., a reverse surface) of the circuit board 20, a ground electrode 27 is formed. The ground electrode 27 is formed over almost the entire region of the reverse surface of the circuit board 20.

As described above, in the second embodiment, the photo detector of the photo detector circuit 21 and the TIA of the amplifier circuit 22 are electrically connected by the wiring pattern 24 (24a and 24c) formed on the surface of the circuit board 20. Here, when a transmission rate of data is high, it is preferable that a length of the wiring pattern 24 be short. However, in flip-chip mounting, as illustrated in FIG. 4, the photo detector circuit 21 and/or the amplifier circuit 22 are fixed to the circuit board 20 by the underfill 26. For that reason, it is difficult to sufficiently shorten a distance between the photo detector circuit 21 and the amplifier circuit 22, and it is difficult to make the length of the wiring pattern 24 shorter than, for example, 1 mm. As a result, in the circuit illustrated in FIG. 2, an oscillation sometimes occurs in a data signal band. A frequency of this oscillation depends on the length of the wiring pattern 24.

In addition, in order to reduce the size of the optical receiver module 2, the photo detectors P1-P4 are mounted close to each other, and the TIA1-TIA4 are also mounted close to each other. A distance at which each of these devices is mounted is, for example, 0.25 mm, as described above. In this case, the wiring pattern 24 (24a and 24c) is formed at each spacing of 0.125 mm. Namely, between the photo detector circuit 21 and the amplifier circuit 22, a wiring pattern 24 (24a and 24c) of each channel is formed very close to a wiring pattern 24 (24a and 24c) of an adjacent channel. As a result, a large crosstalk may occur between channels.

<Simulation>

Figure 6A:
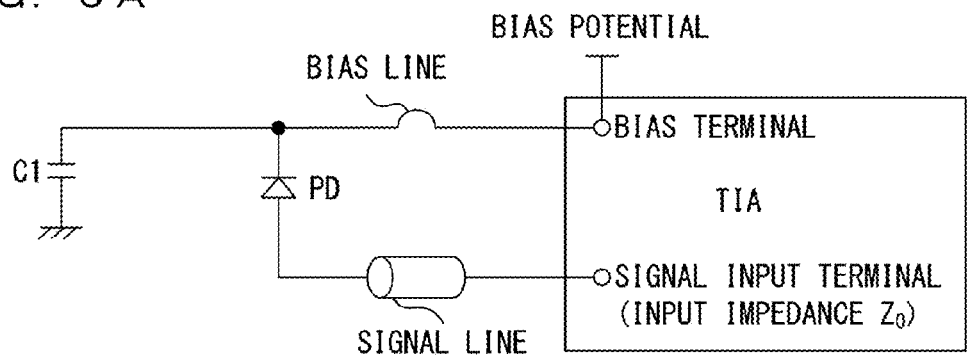
FIGS. 6A and 6B are diagrams explaining simulation models.
Figure 6B:
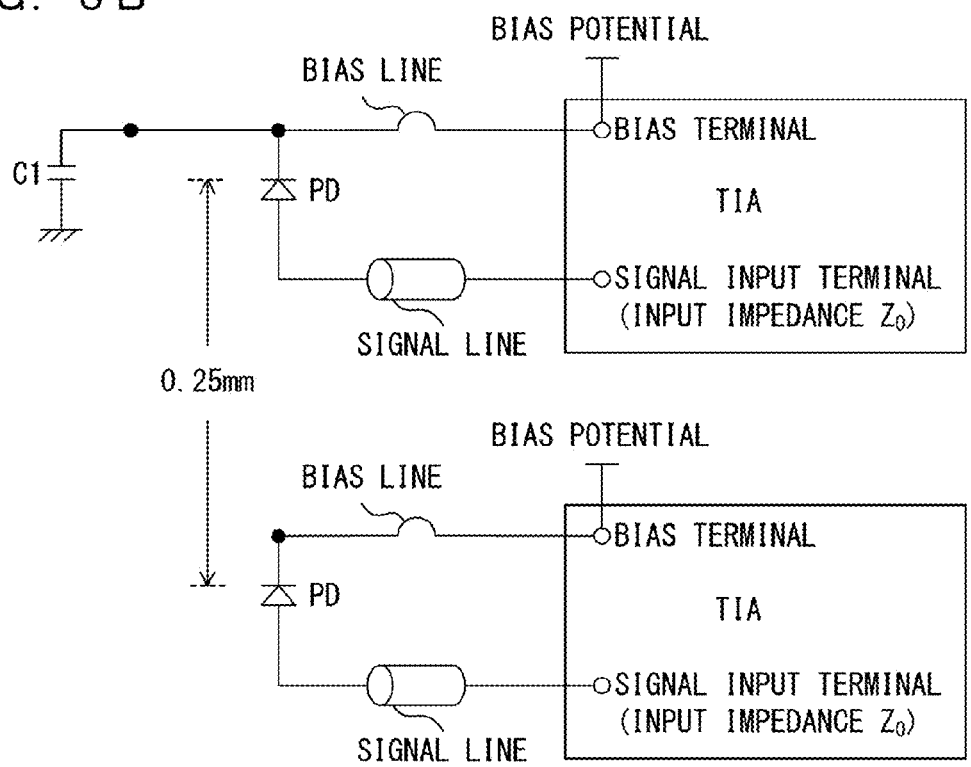

FIGS. 6A and 6B illustrate simulation models. FIG. 6A illustrates a model for simulating transmission characteristics and the like. FIG. 6B illustrates a model for simulating crosstalk and the like.

In FIGS. 6A and 6B, PD represents a photo detector included in the photo detector circuit 11 or the photo detector circuit 21. TIA represents a TIA included in the amplifier circuit 12 or the amplifier circuit 22. The TIA has an input impedance $Z_0$. C1 represents a capacitive element provided between a bias potential and a ground near the photo detector PD. Although not illustrated, a capacitive element may also be provided near the TIA. A bias line electrically connects a cathode of the photo detector PD and a bias terminal of the TIA. A signal line electrically connects an anode of the photo detector PD and a signal input terminal of the TIA. When the crosstalk is simulated, a distance between two photo detectors PD is 0.25 mm, as illustrated in FIG. 6B.

Figure 7A:
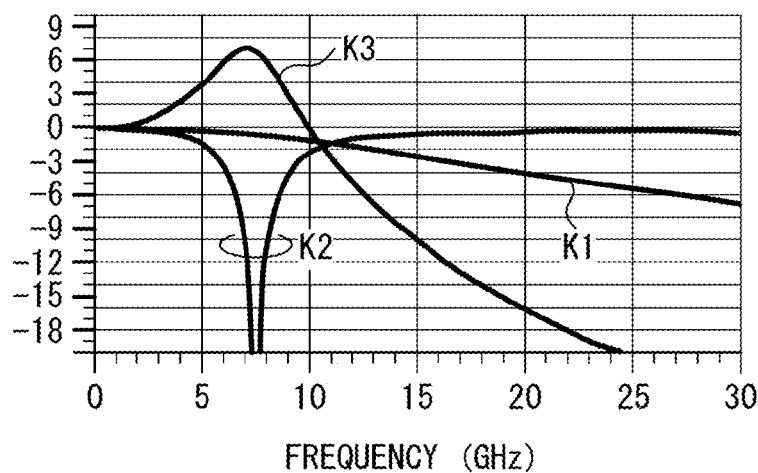
FIGS. 7A-7C illustrate simulation results.
Figure 7B:
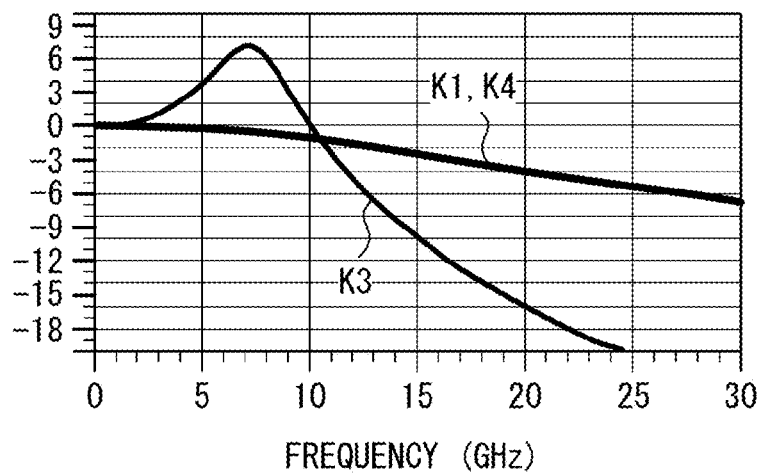
Figure 7C:
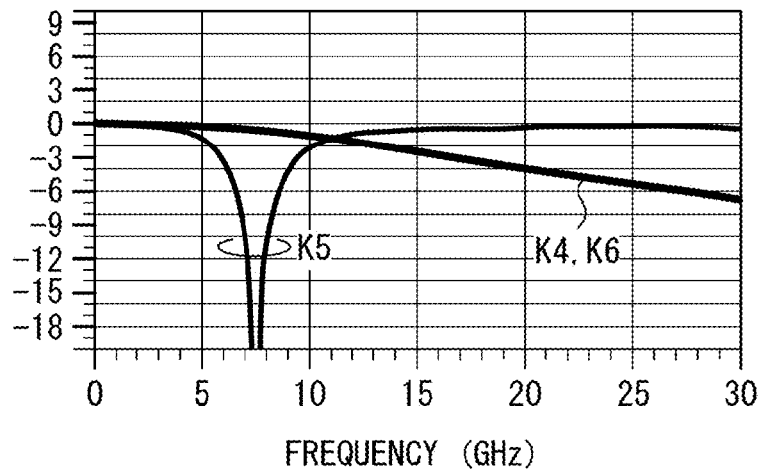

FIGS. 7A-7C illustrate simulation results. In FIGS. 7A-7C, a horizontal axis represents a frequency of a signal. A vertical axis represents a scattering parameter $S_{21}$. The parameter $S_{21}$ represents transmission characteristics (or, attenuation characteristics).

In FIG. 7A, a capacity of C1 is zero. The characteristic K1 represents transmission characteristics that are obtained when it is assumed that the lengths of the bias line and the signal line are respectively zero. Namely, the characteristic K1 represents ideal transmission characteristics.

The characteristic K2 is obtained under the following conditions.

(1) A bias line is implemented by a bonding wire. The length of the bias line is 2 mm.
(2) The length of a signal line is zero.

As represented in the characteristic K2, when the bias line is implemented by a wire, the transmission characteristics may deteriorate greatly at a resonance frequency. In the example illustrated in FIG. 7A, a dip occurs at approximately 7.5 GHz.

The characteristic K3 is obtained under the following conditions.

(1) A signal line is implemented by a bonding wire. The length of the signal line is 2 mm.
(2) The length of a bias line is zero.

As represented in the characteristic K3, when the signal line is implemented by a wire, a peaking occurs due to an inductance component or the like of the line. In the example illustrated in FIG. 7A, a peaking occurs at approximately 7 GHz.

Also in FIG. 7B, a capacity of C1 is zero. The characteristics K1 and K3 are as described with reference to FIG. 7A. Namely, the characteristic K1 represents ideal transmission characteristics. The characteristic K3 represents transmission characteristics that are obtained when the signal line is implemented by a wire.

The characteristic K4 is obtained under the following conditions.

(1) A signal line is implemented by a wiring pattern and an input impedance of the line matches the input impedance $Z_0$ of a TIA. The length of the signal line is 2 mm.
(2) The length of a bias line is zero.

As illustrated in FIG. 7B, the characteristic K4 is almost the same as the characteristic K1. Namely, the characteristic K4 is an almost ideal characteristic. Therefore, when a wiring pattern is formed such that an impedance of the signal line matches the input impedance $Z_0$ of the TIA, transmission characteristics are improved. A method for forming a wiring pattern having a target impedance is a publicly known technology. On the other hand, it is difficult to realize impedance matching in wire bonding.

FIG. 7C illustrates an effect of suppressing a resonance occurring in a circuit between a photo detector and a TIA. The characteristic K4 is as described with reference to FIG. 7B. Namely, the characteristic K4 represents transmission characteristics that are obtained when impedance matching of a signal line is realized. However, the characteristic K4 is obtained when the length of a bias line is zero.

The characteristic K5 is obtained under the following conditions.

(1) A signal line is implemented by a wiring pattern and an input impedance of the line matches the input impedance $Z_0$ of a TIA. The length of the signal line is 2 mm. (Same as the characteristic K4)
(2) The length of a bias line is 2 mm.
(3) A capacity of C1 is zero.

As described above, even when impedance matching of the signal line is realized, when the length of the bias line is not zero, a dip occurs due to a resonance. A resonance frequency (i.e., a frequency at which a dip occurs) depends on the length of the bias line.

The characteristic K6 is obtained under the following conditions.

(1) A signal line is implemented by a wiring pattern and an input impedance of the line matches the input impedance $Z_0$ of a TIA. The length of the signal line is 2 mm. (Same as the characteristic K5)
(2) The length of a bias line is 2 mm. (Same as the characteristic K5)
(3) A capacity of C1 is 1 nF.

The characteristic K6 is an almost ideal characteristic, as illustrated in FIG. 7C. Therefore, as is obvious from the comparison between the characteristics K5 and K6, transmission characteristics are improved by providing a capacitive element C1 between a bias potential and a ground near a photo detector PD. The capacity of C1 is appropriately determined according to the length of a bias line, or the like.

As described above, when impedance matching of a signal line (a wiring pattern between an anode of the photo detector PD and an input signal terminal of the TIA) is made and a cathode of the photo detector PD is coupled to the ground by a capacity of C1, the transmission characteristics are improved. As a result, the increases in speed and bandwidth of an optical receiver including a photo detector and a TIA are realized.

However, in an optical receiver module on which a plurality of photo detectors are mounted close to each other, even when the configuration above is adopted, a problem of crosstalk between channels still exists. Particularly, in an optical receiver module that receives a high-speed signal exceeding 25 Gbps, a large crosstalk may occur.

Third Embodiment

FIGS. 8A-8C illustrate a configuration of an optical receiver module according to the third embodiment. The optical receiver module 3 according to the third embodiment is configured by flip-chip mounting illustrated in FIG. 4. Accordingly, the optical receiver module 3 includes a circuit board 20, a photo detector circuit (PD) 21, an amplifier circuit (TIA) 22, and an optical circuit 23.

FIG. 8A schematically illustrates an arrangement of a photo detector, a TIA, and a wiring pattern. FIG. 8B schematically illustrates a cross section (an A-A cross section in FIG. 8A) of the optical receiver module 3. FIG. 8C schematically illustrates another cross section (a B-B cross section in FIG. 8A) of the optical receiver module 3. In FIGS. 8A-8C, the optical circuit 23, a wiring pattern 25, and an underfill 26 are omitted. In FIG. 8A, photo detectors PD1-PD4 and TIA1-TIA4 are also omitted.

In the optical receiver module 3 according to the third embodiment, similarly to the second embodiment, each of the photo detectors is electrically connected to a corresponding TIA by an anode wiring pattern 24a and a cathode wiring pattern 24c. Here, the anode wiring pattern 24a and the cathode wiring pattern 24c are formed on one surface of the circuit board 20. The anode wiring pattern 24a corresponds to a signal line that propagates an electrical signal (or, a current signal) generated by the photo detector to the corresponding TIA. In addition, the cathode wiring pattern 24c corresponds to a bias line that supplies a bias potential to the photo detector.

However, in the optical receiver module 3 according to the third embodiment, on the other surface (i.e., a reverse surface) of the circuit board 20, a bias electrode 31 is formed so as to include a region in which a plurality of cathode wiring patterns 24c are formed. The bias electrode 31 is represented with a broken line in FIG. 8A. On the reverse surface of the circuit board 20, a ground electrode 32 is formed so as to surround the bias electrode 31. The bias electrode 31 and the ground electrode 32 are electrically coupled by one or a plurality of capacitive elements. In this example, as illustrated in FIG. 8B, a capacitive element C1 is provided near the photo detector PD, and a capacitive element C2 is provided near the TIA.

Each of the cathode wiring patterns 24c is electrically connected to the bias electrode 31. In this example, each of the cathode wiring patterns 24c is electrically connected to the bias electrode 31 by a via 33. Herein, a "via" includes a through-hole.

FIGS. 9A-10B illustrate an example of the optical receiver module 3 according to the third embodiment. The optical receiver module 3 is configured by using the circuit board 20, as described with reference to FIGS. 8A-8C.

Figure 9A:
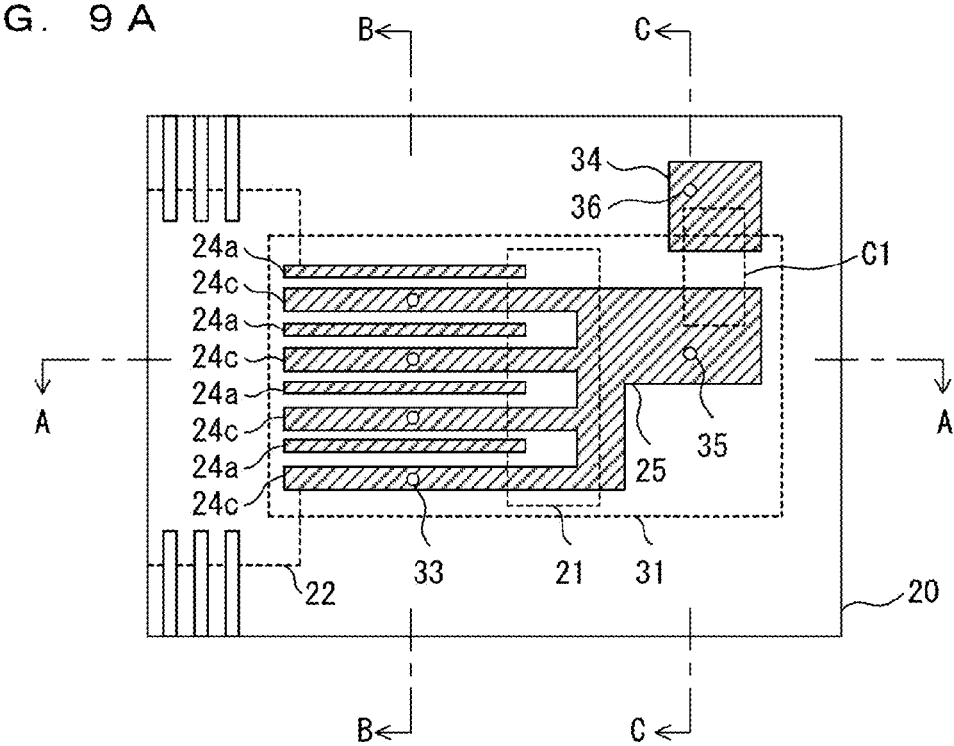
FIGS. 9A and 9B illustrate an example of an optical receiver module according to the third embodiment.
Figure 9B:
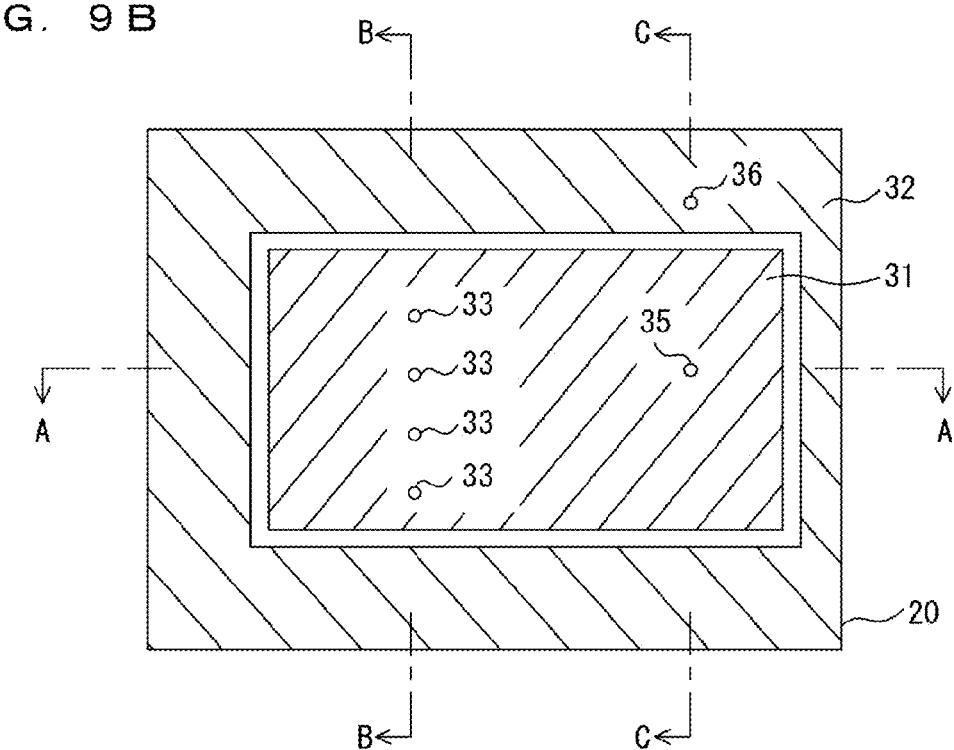

FIG. 9A illustrates a configuration of one surface (a first surface) of the circuit board 20. Hereinafter, this surface is sometimes referred to simply as a "surface". FIG. 9B illustrates a configuration of the other surface (a second surface) of the circuit board 20. Hereinafter, this surface is sometimes referred to as a "reverse surface". FIGS. 10A-10C respectively illustrate configurations of cross sections of the optical receiver module 3 illustrated in FIGS. 9A and 9B. Namely, FIG. 10A, FIG. 10B, and FIG. 10C respectively illustrate an A-A cross section, a B-B cross section, and a C-C cross section of the optical receiver module 3 illustrated in FIGS. 9A and 9B.

On the surface of the circuit board 20, as illustrated in FIG. 9A, the photo detector circuit 21, then amplifier circuit 22, and the capacitive element C1 are mounted. In FIG. 9A, the photo detector circuit 21, the amplifier circuit 22, and the capacitive element C1 are represented with a broken line.

Each of the photo detectors of the photo detector circuit 21 is electrically connected to a corresponding TIA of the amplifier circuit 22 by the anode wiring pattern 24a and the cathode wiring pattern 24c. Here, a plurality of anode wiring patterns 24a and a plurality of cathode wiring patterns 24c are alternately formed as illustrated in FIG. 9A. Therefore, an anode wiring pattern 24a of each channel is formed close to a cathode wiring pattern 24c of an adjacent channel, and a cathode wiring pattern 24c of each channel is formed close to an anode wiring pattern 24a of an adjacent channel.

The plurality of anode wiring patterns 24a are electrically insulated from each other. In addition, each of the anode wiring patterns 24a is formed so as to match an input impedance of a corresponding TIA of the amplifier circuit 22.

The plurality of cathode wiring patterns 24c are electrically connected to a bias electrode 25, as illustrated in FIG. 9A. In other words, the plurality of cathode wiring patterns 24c and the bias electrode 25 form one conductor region. Specifically, the plurality of cathode wiring patterns 24c are formed so as to project from the bias electrode 25. To the bias electrode 25, a bias potential is applied from a voltage source not illustrated. The bias potential is supplied to each of the TIAs of the amplifier circuit 22.

On the reverse surface of the circuit board 20, a bias electrode 31 is formed. To the bias electrode 31, a bias potential is applied from the voltage source not illustrated. Namely, the same bias potential is applied to the bias electrode 25 and the bias electrode 31. The bias electrode 25 and the bias electrode 31 are electrically connected to each other by a via 35. In addition, the bias electrode 31 is formed on the reverse surface of the circuit board 20 so as to include a region in which at least the cathode wiring patterns 24c are formed, as described above. In this example, the bias electrode 31 is formed so as to include a region in which the anode wiring patterns 24a, the cathode wiring patterns 24c, and the bias electrode 25 are formed. On the reverse surface of the circuit board 20, a ground electrode 32 is formed so as to surround the bias electrode 31. The ground electrode 32 is electrically connected to a ground outside the optical receiver module 3.

Each of the cathode wiring patterns 24c is electrically connected to the bias electrode 31 formed on the reverse surface of the circuit board 20 by the via 33. Each of the vias 33 is provided, for example, in an approximately intermediate position between a photo detector of the photo detector circuit 21 and a TIA of the amplifier circuit 22. Note that in the example illustrated in FIGS. 9A and 9B, one via 33 is provided for each of the cathode wiring patterns 24c, but a plurality of vias 33 may be provided for each of the cathode wiring patterns 24c.

On the surface of the circuit board 20, a capacitive element C1 electrically couples the bias electrode 25 and a ground electrode 34. Here, the ground electrode 34 is electrically connected to the ground electrode 32 formed on the reverse surface of the circuit board 20 by a via 36. Therefore, the capacitive element C1 is provided substantially between a bias potential and the ground. A capacity of the capacitive element C1 is determined by, for example, a simulation or a measurement such that a resonance of the circuit illustrated in FIG. 2 does not occur in a data signal band. A frequency of the resonance depends on the length of the anode wiring pattern 24a.

As described above, in the optical receiver module 3 according to the third embodiment, the bias electrode 31 is formed so as to include a region in which the cathode wiring patterns 24c supplying a bias potential to a cathode of each of the photo detectors are formed. Each of the cathode wiring patterns 24c is electrically connected to the bias electrode 31. Therefore, a potential of each of the cathode wiring patterns 24c is stabilized, and a bias potential applied to a cathode potential of each of the photo detectors is also stabilized.

In the configuration, as illustrated in FIGS. 5A and 5B, in which a ground electrode is formed on the entirety of the reverse surface of the circuit board 20, noise is suppressed. However, in this configuration, when a plurality of anode wiring patterns and a plurality of cathode wiring patterns are formed close to each other, and when a high speed data signal is received, a potential of a cathode wiring pattern of each channel is affected by a signal of an anode wiring pattern of an adjacent channel. Namely, it is difficult to sufficiently suppress crosstalk between channels.

In contrast, in the optical receiver module 3 according to the third embodiment, the bias electrode 31 is provided so as to include a region in which the cathode wiring patterns 24c are formed, and each of the cathode wiring patterns 24c is electrically connected to the bias electrode 31. Therefore, even when a plurality of anode wiring patterns 24a and a plurality of cathode wiring patterns 24c are formed close to each other and a high speed data signal is received, a potential of each of the cathode wiring patterns 24c is hardly affected by a signal of each of the cathode wiring patterns 24c of an adjacent channel. Namely, crosstalk is sufficiently suppressed. As a result, an electrical signal (or, a current signal) generated by a photo detector precisely represents an intensity of a received optical signal.

Effects According to Embodiments

FIGS. 11A-14B illustrate a comparison between a configuration in which a ground electrode is formed on the entirety of a reverse surface of a circuit board (for example, a configuration illustrated in FIGS. 5A and 5B) and a configuration in which a bias electrode is formed on the reverse surface of the circuit board (for example, a configuration illustrated in FIGS. 8A-8C). FIG. 11A, FIG. 12A, FIG. 13A, and FIG. 14A illustrate simulation results in the configuration in which the ground electrode is formed on the entirety of the reverse surface of the circuit board (hereinafter referred to as a "GND configuration"). FIG. 11B, FIG. 12B, FIG. 13B, and FIG. 14B illustrate simulation results in the configuration in which the bias electrode is formed on the reverse surface of the circuit board (hereinafter referred to as a "configuration according to the third embodiment").

Simulation models are as described with reference to FIGS. 6A and 6B. Assume that the lengths of a signal line (i.e., an anode wiring pattern 24a) and a bias line (i.e., a cathode wiring pattern 24c) are respectively 2 mm.

Figure 11A:
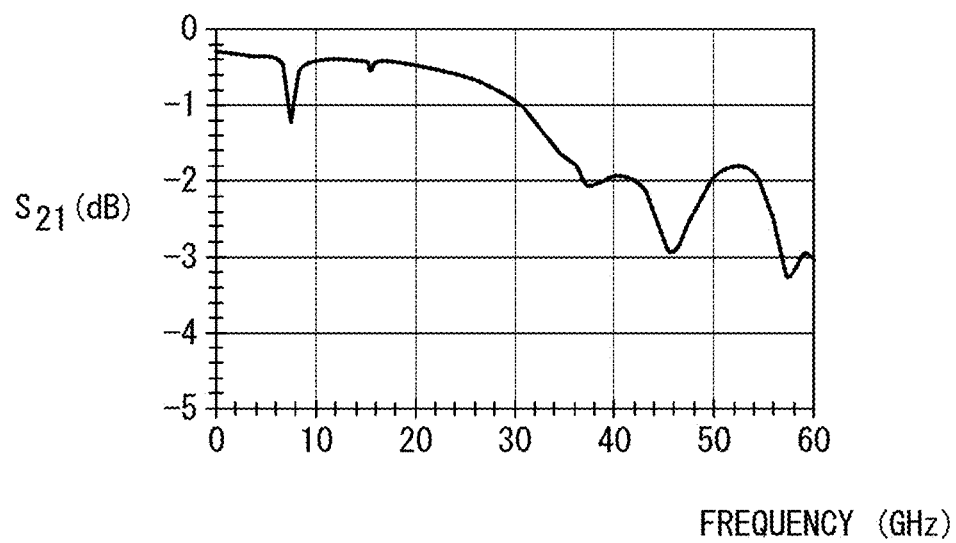
Figure 11B:
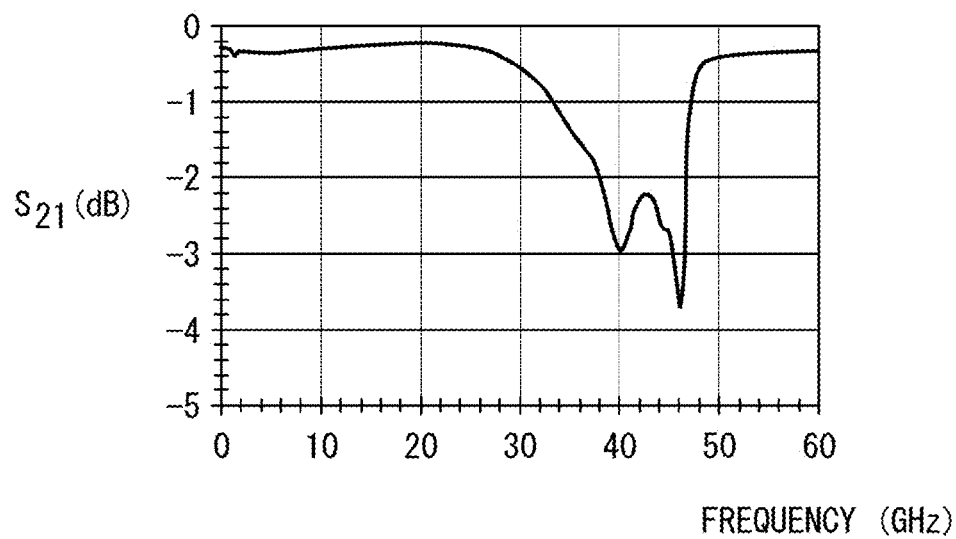

FIGS. 11A and 11B illustrate simulation results for a scattering parameter $S_{21}$. $S_{21}$ represents transmission characteristics. In the GND configuration, as illustrated in FIG. 11A, a dip occurs at approximately 7.5 GHz. On the other hand, in the configuration according to the third embodiment, as illustrated in FIG. 11B, satisfactory transmission characteristics are obtained in the range of 0-30 GHz.

Figure 12A:
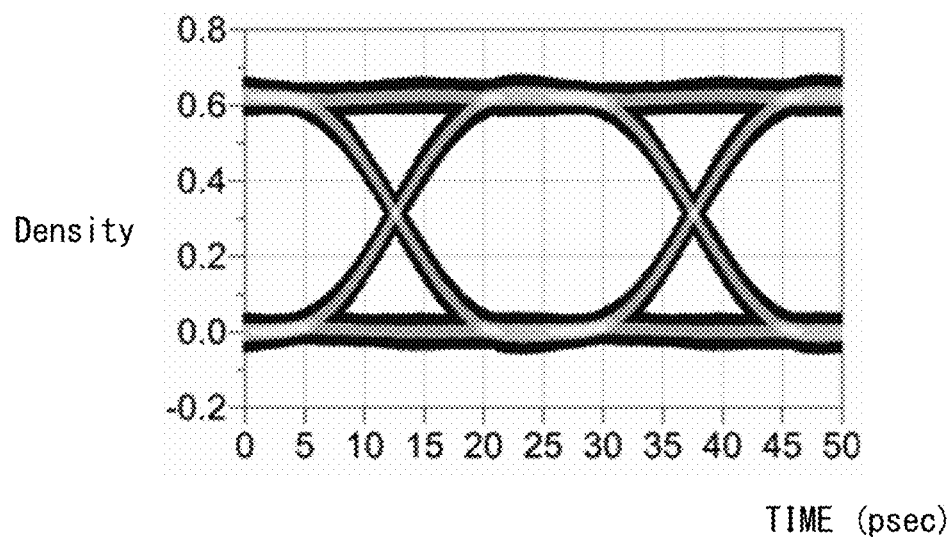
Figure 12B:
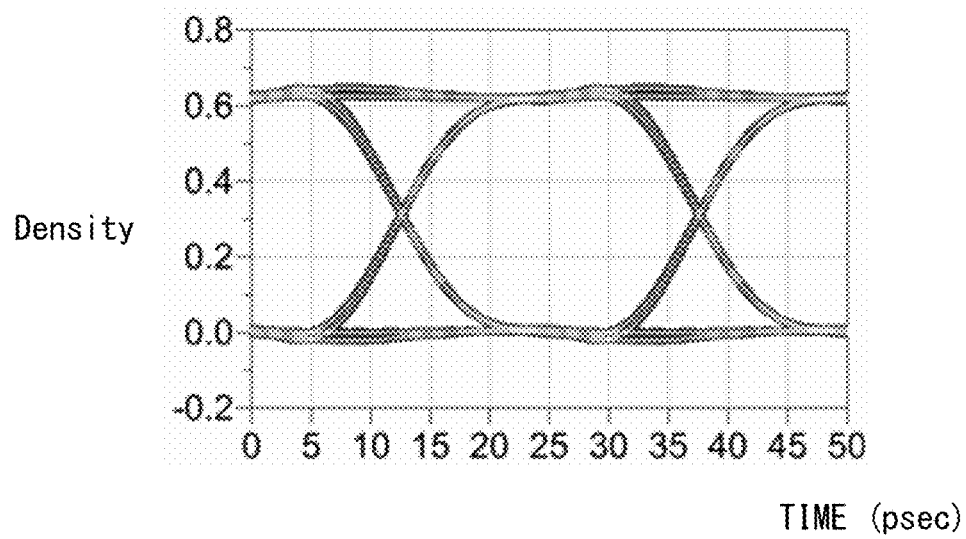

FIGS. 12A and 12B illustrate simulation results for an eye pattern. In this example, a transmission rate of a data signal is 40 Gbps. Assume that a signal of an interested channel is not affected by its adjacent channel. Namely, assume that there is no crosstalk. As is obvious from a comparison between FIG. 12A and FIG. 12B, in the configuration according to the third embodiment, jitter becomes smaller, and an eye aperture becomes larger than those in the GND configuration.

FIGS. 13A and 13B illustrate simulation results for a scattering parameter $S_{41}$. $S_{41}$ represents crosstalk. In this example, photo detectors PD are mounted at each distance of 0.25 mm, as illustrated in FIG. 6B. In the GND configuration, as illustrated in FIG. 13A, crosstalk occurs even in a band lower than 10 GHz. In contrast, in the configuration according to the third embodiment, as illustrated in FIG. 13B, the crosstalk is sufficiently suppressed in the range of 0-10 GHz. In addition, the crosstalk is suppressed in the range of 10-30 GHz comparing with the GND configuration.

FIG. 14 illustrates simulation results for an eye pattern. In this example, similarly to the simulation illustrated in FIGS. 12A and 12B, a transmission rate of a data signal is 40 Gbps. However, unlike the simulation illustrated in FIGS. 12A and 12B, assume that a signal of an interested channel is affected by its adjacent channel. Also assume that photo detectors PD are mounted at each distance of 0.25 mm. In the GND configuration, as illustrated in FIG. 14A, an eye aperture is quite small, and a jitter is large. In contrast, in the configuration according to the third embodiment, both the eye aperture and jitter characteristics are greatly improved in comparison with the GND configuration. As described above, the crosstalk is particularly suppressed in the configuration according to the third embodiment.

OTHER EMBODIMENTS

Figure 15A:
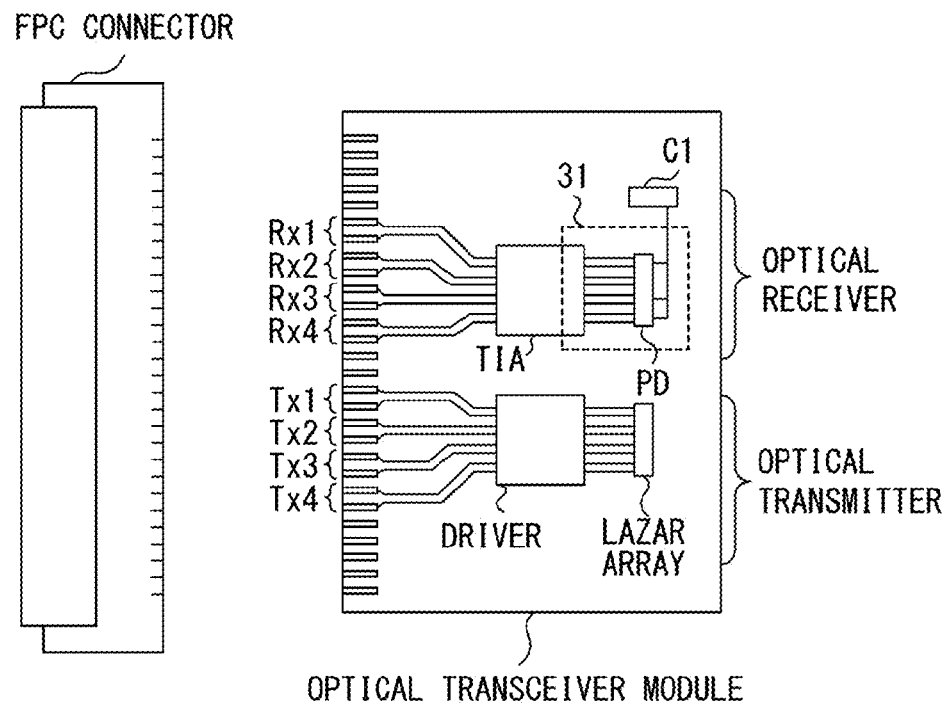
FIGS. 15A and 15B illustrate configurations according to other embodiments.

FIG. 15A illustrates a configuration of an optical transceiver module according to another embodiment. This optical transceiver module includes an optical receiver and an optical transmitter on a flexible printed circuit. The optical receiver includes a photo detector circuit (PD), an amplifier circuit (TIA), and a capacitive element C1, similarly to the optical receiver module according to the third embodiment. In addition, on a reverse surface of the flexible printed circuit, a bias electrode 31 is formed so as to include a region between the photo detector circuit PD and the amplifier circuit TIA in which cathode wiring patterns are formed. Further, the optical transmitter includes a laser array and a driver. The laser array is implemented by, for example, a VCSEL (Vertical-Cavity Surface-Emitting Laser) array.

The optical transceiver module illustrated in FIG. 15A accommodates four reception channels Rx1-Rx4 and four transmission channels Tx1-Tx4. Here, each of the channels transmits a differential signal. In addition, at an edge of the flexible printed circuit, electrodes for electrically contacting with corresponding terminals of an FPC connector are formed. In this example, eight continuous electrodes are allocated to the reception channels Rx1-Rx4, and another eight continuous electrodes are allocated to the transmission channels Tx1-Tx4. In FIG. 15A, an electrode and a wiring for a power source, an electrode and a wiring for a ground, and an electrode and a wiring for a control signal are omitted.

Figure 15B:
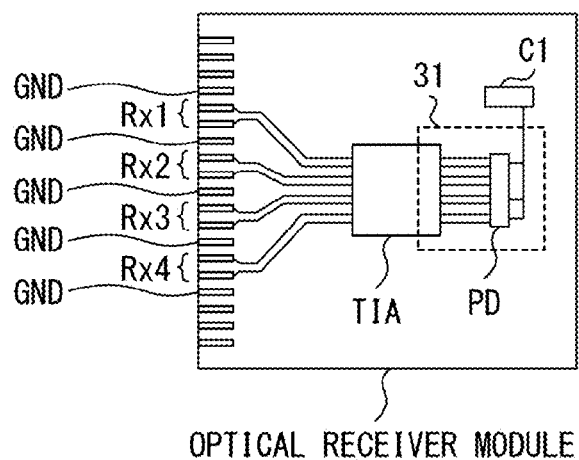

In the example illustrated in FIG. 15A, the optical receiver and the optical transmitter are provided on one circuit board, but the optical receiver and the optical transmitter may be provided on different circuit boards. For example, FIG. 15B illustrates an example of an optical receiver module accommodating reception channels Rx1-Rx4. This optical receiver module includes a photo detector circuit (PD), an amplifier circuit (TIA), and a capacitive element C1. On a reverse surface of a circuit board, a bias electrode 31 is provided so as to include a region between the photo detector circuit PD and the amplifier circuit TIA in which cathode wiring patterns are formed. In this example, the allocation of electrodes for electrically contacting with an FPC connector is different from that in the example illustrated in FIG. 15A. Namely, GND electrodes are allocated so as to separate channels.

In the embodiments above, components (e.g., a photo detector or a TIA) are mounted on one surface of a circuit board, and a bias electrode 31 is formed on the other surface; however, the present invention is not limited to this configuration. For example, when a circuit board includes an inner layer, a bias electrode 31 may be formed in the inner layer.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:
1. An optical receiver module comprising:
a circuit board;
a plurality of photo detectors mounted on a first surface of the circuit board;
a plurality of amplifiers mounted on the first surface of the circuit board, the plurality of amplifiers corresponding to the plurality of photo detectors;
a plurality of anode wiring patterns that are respectively formed between anode terminals of the plurality of photo detectors and the plurality of amplifiers on the first surface of the circuit board;

a plurality of cathode wiring patterns that are respectively formed between cathode terminals of the plurality of photo detectors and the plurality of amplifiers on the first surface of the circuit board;

a bias electrode formed on a second surface of the circuit board or in an inner layer of the circuit board so as to include a region in which the plurality of cathode wiring patterns are formed; and a ground electrode formed on the second surface of the circuit board so as to surround the bias electrode; wherein the ground electrode is electrically connected to a ground, a bias potential of the plurality of amplifiers is applied to the bias electrode, the bias potential being different from a potential of the ground, and the plurality of cathode wiring patterns are respectively electrically connected to the bias electrode.

2. The optical receiver module according to claim 1, wherein the plurality of cathode wiring patterns and the plurality of anode wiring patterns are formed alternately on the first surface.

3. The optical receiver module according to claim 1, wherein the bias electrode is electrically coupled to the ground electrode by a capacitive element.

4. The optical receiver module according to claim 1, wherein the bias electrode and the ground electrode are electrically coupled near the plurality of photo detectors by a capacitive element.

5. The optical receiver module according to claim 1, wherein the plurality of cathode wiring patterns are respectively electrically connected to the bias electrode by a via or a through-hole.

6. The optical receiver module according to claim 5, wherein the via or the through-hole electrically connects each of the cathode wiring patterns to the bias electrode in an approximately intermediate position between the plurality of photo detectors and the plurality of amplifiers.

7. An optical transceiver module that includes an optical transmitter module accommodating a plurality of channels and an optical receiver module accommodating a plurality of channels, wherein the optical receiver module includes:
a circuit board;
a plurality of photo detectors mounted on a first surface of the circuit board;
a plurality of amplifiers mounted on the first surface of the circuit board, the plurality of amplifiers corresponding to the plurality of photo detectors;
a plurality of anode wiring patterns that are respectively formed between anode terminals of the plurality of photo detectors and the plurality of amplifiers on the first surface of the circuit board;
a plurality of cathode wiring patterns that are respectively formed between cathode terminals of the plurality of photo detectors and the plurality of amplifiers on the first surface of the circuit board; and
a bias electrode formed on a second surface of the circuit board or in an inner layer of the circuit board so as to include a region in which the plurality of cathode wiring patterns are formed; and
a ground electrode formed on the second surface of the circuit board so as to surround the bias electrode; wherein the ground electrode is electrically connected to a ground, a bias potential of the plurality of amplifiers is applied to the bias electrode, the bias potential being different from a potential of the ground, and the plurality of cathode wiring patterns are respectively electrically connected to the bias electrode.

8. An optical receiver module comprising:
a circuit board;
a plurality of photo detectors mounted on a first surface of the circuit board;
a plurality of amplifiers mounted on the first surface of the circuit board, the plurality of amplifiers corresponding to the plurality of photo detectors;
a plurality of anode wiring patterns that are respectively formed between anode terminals of the plurality of photo detectors and the plurality of amplifiers on the first surface of the circuit board;
a plurality of cathode wiring patterns that are respectively formed between cathode terminals of the plurality of photo detectors and the plurality of amplifiers on the first surface of the circuit board; and
a bias electrode formed on a second surface of the circuit board or in an inner layer of the circuit board so as to include a region in which the plurality of cathode wiring patterns are formed, wherein a bias potential of the plurality of amplifiers is applied to the bias electrode, the bias potential being different from a potential of a ground, the bias electrode is electrically coupled to the ground by a capacitive element, and the plurality of cathode wiring patterns are respectively electrically connected to the bias electrode.

\* \* \* \* \*